(12) United States Patent
Sato

(10) Patent No.: US 8,461,010 B2
(45) Date of Patent: Jun. 11, 2013

(54) SEMICONDUCTOR DEVICE AND METHOD FOR MANUFACTURING SAME

(75) Inventor: Masaharu Sato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 745 days.

(21) Appl. No.: 11/782,726

(22) Filed: Jul. 25, 2007

(65) Prior Publication Data

US 2008/0023797 A1    Jan. 31, 2008

(30) Foreign Application Priority Data

Jul. 28, 2006    (JP) ................................. 2006-206051

(51) Int. Cl.
 H01L 29/861    (2006.01)
 H01L 21/20    (2006.01)
 H01L 21/331    (2006.01)

(52) U.S. Cl.
 USPC ................... 438/330; 257/603; 257/E29.237; 257/E21.335; 257/E21.37; 257/E21.375; 438/380

(58) Field of Classification Search
 USPC .......... 438/220, 330, 380, 202–208; 257/110, 257/279, 458, 461–464, 470, 490, 494–495, 257/509, 525, 544–550, 656, 927, 929, E21.382–E21.385, E21.695–E21.696
 See application file for complete search history.

(56) References Cited

U.S. PATENT DOCUMENTS

| 3,648,125 A * | 3/1972 | Peltzer ........................... 257/515 |
| 3,759,762 A * | 9/1973 | Barone et al. ................. 438/383 |
| 4,694,562 A * | 9/1987 | Iwasaki et al. ................ 438/207 |
| 4,892,836 A * | 1/1990 | Andreini et al. .............. 438/208 |
| 5,208,171 A * | 5/1993 | Ohmi ............................ 438/203 |
| 2007/0281433 A1* | 12/2007 | Mollat et al. .................. 438/380 |

FOREIGN PATENT DOCUMENTS

JP    10-74959 A    3/1998

OTHER PUBLICATIONS

"Physics of Semiconductor Device", authored by S. M. Sze, passages 2. 6. 1 (Transient Behavoir), 2. 7. 5 (Fast-Recovery Diode), and 2. 7. 6 (Charge-Storage Diode)].

"Reduction in Minority Carrier Storage Effect by Fluorine Ion Implantation Damage", IEEE Transactions on Electron Devices, vol. ED-25, No. 7, Jul. 1978, pp. 772-778.

\* cited by examiner

*Primary Examiner* — David Vu
*Assistant Examiner* — Jonathan Han
(74) *Attorney, Agent, or Firm* — Sughrue Mion, PLLC

(57) ABSTRACT

In conventional processes, a recombination rate of minority carrier accumulated between a diffusion layer of an anode and a diffusion layer of a cathode cannot be enhanced. An interlayer insulating film 20 is formed on a semiconductor substrate 10. An opening 22 (first opening), an opening 24 (second opening) and an opening 26 are formed in the interlayer insulating film 20. The opening 22 and the opening 26 are formed above respective the p-type diffusion layer 16 and the n-type diffusion layer 18. The opening 24 is formed above the gap region that is a region between the p-type diffusion layer 16 and the n-type diffusion layer 18. A contact plug 32, a contact plug 34 and a contact plug 36 are embedded in the opening 22, the opening 24 and the opening 26 respectively. Both regions of the semiconductor substrate 10 located under the opening 22 among and located under the opening 24 are doped with an impurity.

16 Claims, 12 Drawing Sheets

SEMICONDUCTOR DEVICE AND METHOD FOR MANUFACTURING SAME

This application is based on Japanese patent application No. 2006-206,051, the content of which is incorporated hereinto by reference.

BACKGROUND

1. Technical Field

The present invention relates to a semiconductor device and a method for manufacturing thereof.

2. Related Art

It is known that a reverse current is flowed as shown in FIG. 11, when an operation of a PN junction diode is switched from a forward operation to an off state [see, for example, "Physics of Semiconductor Device", authored by S. M. Sze, passages 2. 6. 1 (Transient Behavior), 2. 7. 5 (Fast-Recovery Diode), and 2. 7. 6 (Charge-Storage Diode)]. This is a phenomenon, which is occurred by reducing a concentration of a minority carrier, which has been accumulated in a diffusion layer in the forward operation of the diode, to an original concentration in a switch to an off state. The minority carrier is recombined in a diffusion layer to be dissipated, or, when an electric current path is present, the minority carrier is released toward outside and is observed as a reverse current.

If a concentration in the diffusion layer is lower as in a diode having higher breakdown voltage in particular, a recombination rate of the minority carrier is also reduced, causing an increase in time for flowing reverse current therethrough (recovering time). Consequently, a defective situation may be arisen in the operation due to an unexpected reverse current in some circuit. Further, in bipolar transistors utilizing action of minority carrier, a problem of deteriorating the switching characteristic is also occurred by an increase of a recovering time.

An use of a fast recovery diode is proposed as a method for reducing such recovery time in "Physics of Semiconductor Device", authored by S. M. Sze, passages 2. 6. 1 (Transient Behavior), 2. 7. 5 (Fast-Recovery Diode), and 2. 7. 6 (Charge-Storage Diode). Further, one of typical fast recovery diodes is a Schottky diode. While the recovery time can be ignored by employing the Schottky diode due to smaller amount of accumulated minority carrier, the use of the Schottky diode may cause problems of larger leakage current and difficulty in providing higher voltage-resistance. Further, proposed another solution for reducing the recovery time is to reduce lifetime of a carrier by diffusing gold (Au) or the like to accelerate an annihilation thereof. However, when such solution is applied to integrated circuits, a problem of occurring non-negligible influences to other devices is caused.

A method for solving these problems is disclosed in "Reduction in Minority Carrier Storage Effect by Fluorine Ion Implantation Damage", IEEE Transactions on Electron Devices, Vol. ED-25, No. 7, July 1978, pp. 772-778. Such method will be is described in reference to FIG. 12. In FIG. 12, an n-type region 102 is formed in a p-type substrate 101, and a p-type diffusion layer 103 is formed in the n-type region 102. A diode is composed of the n-type region 102 and the p-type diffusion layer 103. Further, an n-type diffusion layer 106 functioning as a contact layer of such region is formed in the n-type region 102. An interlayer insulating film 104 is formed on the p-type substrate 101. An opening 105 is formed on a section of the interlayer insulating film 104 located above the p-type diffusion layer 103.

The above-described article in IEEE Transactions on Electron Devices describes that fluorine ion is injected into a lower portion of the p-type diffusion layer 103 through the opening 105 of the interlayer insulating film 104, and the injection damage occurred in such injection promotes an increased rate of recombination of minority carrier. In FIG. 12, a region where fluorine is injected is schematically illustrated with x marks.

In addition to the above described two literatures, other prior art document related to the present invention is Japanese Patent Laid-Open No. H10-74,959 (1998).

However, ion implantation is achieved only in the lower portion of the p-type diffusion layer 103 by the method described in reference to FIG. 12. Hence, the recombination rate of minority carrier accumulated between the p-type diffusion layer 103 and the n-type diffusion layer 106 cannot be enhanced.

SUMMARY

According to one aspect of the present invention, there is provided a method for manufacturing a semiconductor device, comprising: preparing a semiconductor substrate having a first impurity-diffusing layer of a first conductivity type and a second impurity-diffusing layer of a second conductivity type, both of which are formed in a surface layer; forming an interlayer insulating film on the semiconductor substrate; patterning the interlayer insulating film so that a first opening is formed above the first impurity-diffusing layer and a second opening is formed above a gap region, which is a region between the first impurity-diffusing layer and the second impurity-diffusing layer; and injecting an impurity to the semiconductor substrate through the first and the second openings.

In such method for manufacturing the semiconductor device, the opening is formed above the gap region, which is a region between said first impurity-diffusing layer and said second impurity-diffusing layer, in addition to being formed in the portion above the first impurity-diffusing layer. Since this allows forming a damaged layer due to an injection of an impurity into the gap region, a recombination rate of minority carrier accumulated there can be enhanced.

According to one aspect of the present invention, there is provided a semiconductor device, comprising: a semiconductor substrate; a first impurity-diffusing layer having a first conductivity type and a second impurity-diffusing layer having a second conductivity type, formed in a surface layer of the semiconductor substrate; a first electroconducting plug embedded in a first opening that is provided above the first impurity-diffusing layer; and a second electroconducting plug embedded in a second opening that is provided above a gap region, the gap region being a region between the first impurity-diffusing layer and the second impurity-diffusing layer, wherein an impurity is injected into a region located under the first and the second openings of the semiconductor substrate.

In the semiconductor device, the electroconducting plug (second electroconducting plug) is provided above the gap region, in addition to being formed above the first impurity-diffusing layer. According to the semiconductor device having such configuration, an impurity is injected through the opening for the second electroconducting plug (second opening) during the manufacture thereof, such that a damaged layer is also formed in the above-described gap region. Actually, in the semiconductor device, an impurity is injected under the second opening portion Consequently, a recombination rate of minority carrier accumulated in the gap region can be enhanced.

According to the present invention, the semiconductor device having the structure suitable for reducing the recovering time and the method for manufacturing thereof are achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Preferable exemplary implementations of semiconductor devices and methods for manufacturing semiconductor devices according to the present invention will be described in reference to the annexed figures. In all figures, identical numeral is assigned to an element commonly appeared in the description of the present invention in reference to the figures, and the detailed description thereof will not be repeated.

First Embodiment

Figure 1:
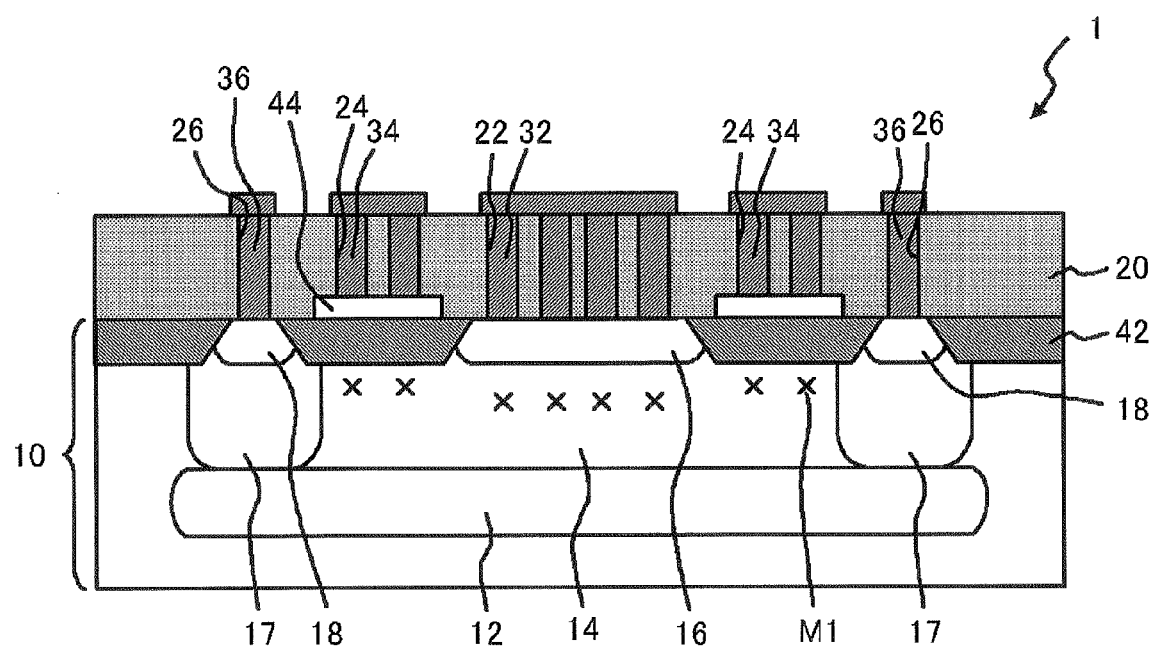
FIG. 1 is a cross-sectional view, illustrating first embodiment of a semiconductor device according to the present invention.

FIG. 1 is a cross-sectional view, illustrating first embodiment of a semiconductor device according to the present invention. A semiconductor device 1 includes a semiconductor substrate 10, a contact plug 32 (first electroconducting plug) and a contact plug 34 (second electroconducting plug). In the present embodiment, the semiconductor substrate 10 is a p-type silicon substrate. An n+ type buried region 12 is formed in the semiconductor substrate 10. An n-type region 14 is formed on the n+ type buried region 12, and a p-type diffusion layer 16 is formed in a surface layer of the n-type region 14. The n-type region 14 and the p-type diffusion layer 16 constitute a diode. Further, an n+ type region 17 extending from the surface of the semiconductor substrate 10 is formed so as to reach the n+ type buried region 12. An n-type diffusion layer 18 is formed in a surface layer of the n+ type region 17. Such n-type diffusion layer 18 functions as a contact layer of the n-type region 14.

An element isolation region 42 for separating the above-described diode from the other elements is also formed in the surface layer of the semiconductor substrate 10. The element isolation region 42 may be configured of, for example, local oxidation of silicon (LOCOS) or shallow trench isolation (STI). In the present embodiment, the additional element isolation region 42 is also formed between the p-type diffusion layer 16 and the n-type diffusion layer 18.

An interlayer insulating film 20 is formed on the semiconductor substrate 10. An opening 22 (the first opening), an opening 24 (the second opening) and an opening 26 are formed in the interlayer insulating film 20. The opening 22 and the opening 26 are formed above respective the p-type diffusion layer 16 and the n-type diffusion layer 18. The opening 24 is formed above the gap region that is a region between the p-type diffusion layer 16 and the n-type diffusion layer 18. A plurality of openings 22 are formed per one p-type diffusion layer 16, and a plurality of opening 24 is formed per one gap region.

A contact plug 32, a contact plug 34 and a contact plug 36 are embedded in the opening 22, the opening 24 and the opening 26 respectively. The contact plug 32 and the contact plug 36 function as contact plugs of an anode and a cathode, respectively. On the contrary, the contact plug 34 is a pseudo or dummy contact plug, or in other words, a contact plug, the presence of which does not affect a circuit architecture of the semiconductor device 1. In the present embodiment, gate electrode 44 serving as a pseudo electrode is formed in the interlayer insulating film 20, and one end of the contact plug 34 is coupled to the gate electrode 44. The gate electrode 44 is composed of, for example, polysilicon, and is formed simultaneously with forming the gate electrode of a field effect transistor (FET), which is not shown in the diagram.

Both regions of the semiconductor substrate 10 located under the opening 22 among and located under the opening 24 are doped with an impurity. Such impurity functions as neither a donor nor an acceptor, and typical examples of such type of impurity include, for example, fluorine (F), silicon (Si), carbon (C) and Germanium (Ge). In FIG. 1, a region where such impurity is injected is schematically illustrated with x marks.

Figure 2A:
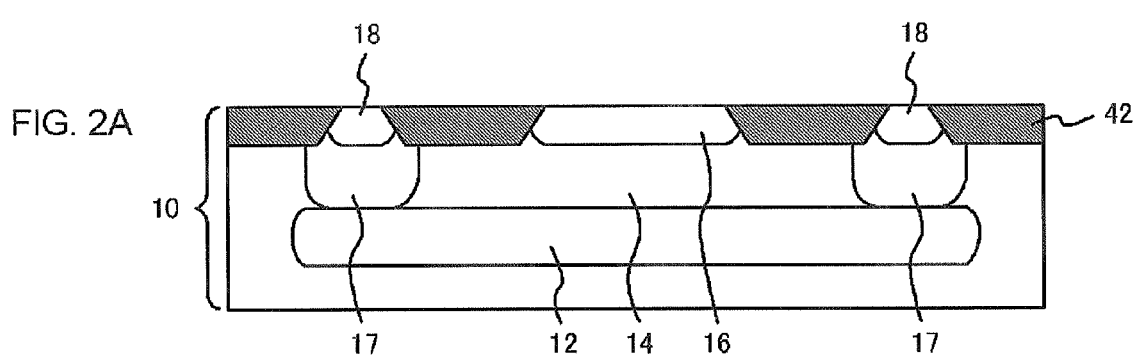
FIG. 2A and FIG. 2B are cross-sectional views, illustrating an embodiment of a method for manufacturing the semiconductor device according to the present invention.
Figure 2B:
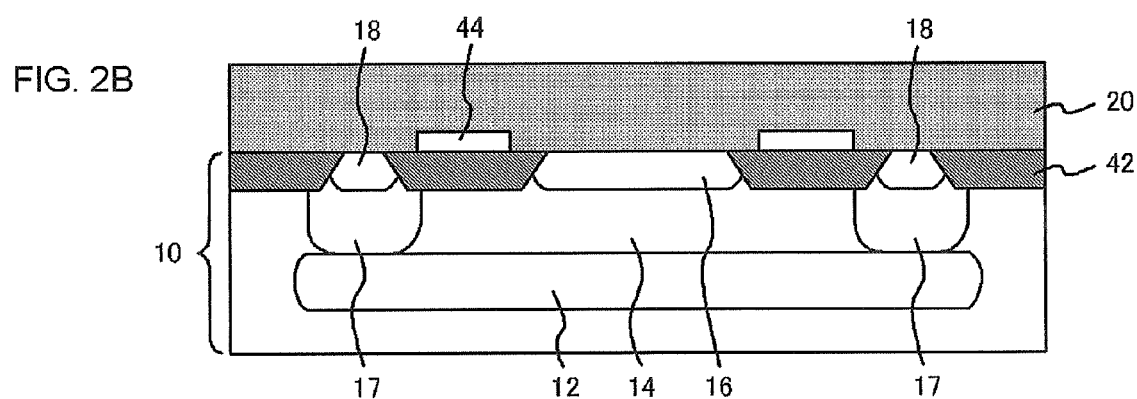

An example of a method for manufacturing the semiconductor device 1 will be presented as an exemplary implementation of a method for manufacturing a semiconductor device according to the present invention, in reference to FIG. 2 and FIG. 3. First of all, a semiconductor substrate 10 having a p-type diffusion layer 16, an n-type diffusion layer 18 or the like formed therein is prepared (FIG. 2A). Next, a gate electrode 44 is formed on the semiconductor substrate 10, and an interlayer insulating film 20 is formed so as to cover the gate electrode 44 (FIG. 2B).

Figure 3A:
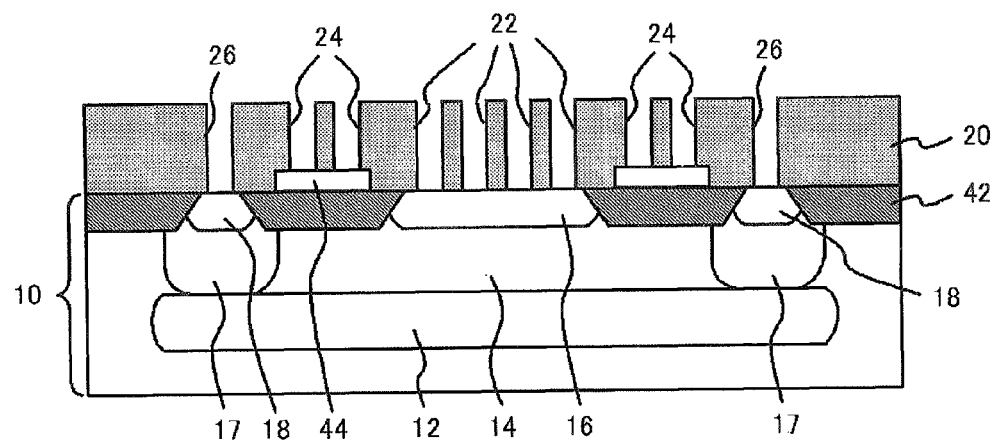
FIG. 3A and FIG. 3B are cross-sectional views, illustrating the embodiment of the method for manufacturing the semiconductor device according to the present invention.
Figure 3B:
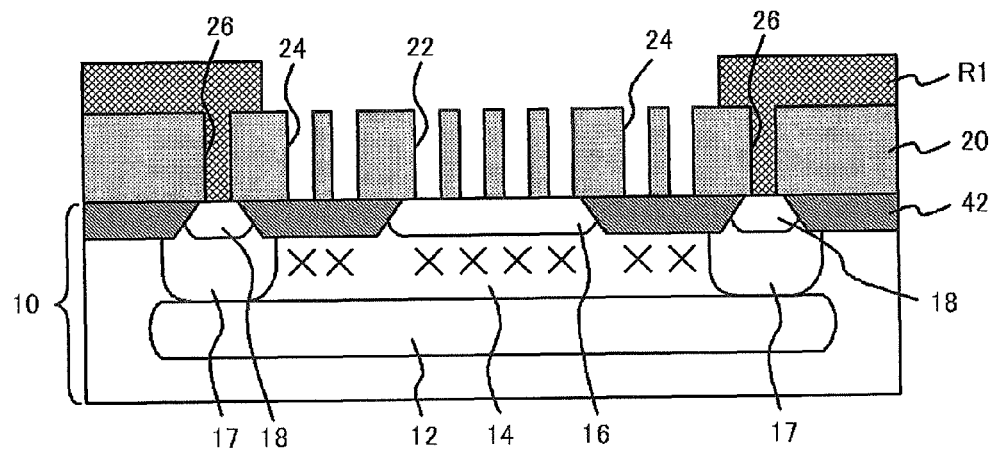

Subsequently, an opening 22 and an opening 26 are formed above the p-type diffusion layer 16 and the n-type diffusion layer 18, respectively, and the interlayer insulating film 20 is patterned so that an opening 24 is formed above the above-described gap region. In such case, the gate electrode 44 is employed for an etch stop, so that the opening 24 is formed so as not to reach to the n-type region 14 (FIG. 3A). Thereafter, an impurity is injected into the semiconductor substrate 10 through the opening 22 and the opening 24. In such case, in the present embodiment, an impurity is injected while the opening 26 is covered with a photo resist R1 (FIG. 3B). Subsequently, the photo resist R1 is stripped, and then contact plugs 32, 34 and 36 are formed to obtain the semiconductor device 1 shown in FIG. 1.

Advantageous effects obtainable by employing the configuration of the present embodiment will be described. In the semiconductor device 1, the electroconducting plug (contact plug 34) is also provided above the gap region, in addition to above the p-type diffusion layer 16. According to the semiconductor device 1 having such structure, in the manufacturing process, an impurity is injected through the opening 24 for contact plug 34 to allow forming a damaged layer in the gap region. Actually, in the present embodiment, the damaged layer is formed in the gap region as described above. This allows enhancing a recombination rate of minority carrier accumulated in the gap region. Therefore, further reduction in the recovering time can be achieved, as compared with a case of forming a damaged layer only under the p-type diffusion layer 16. As described above, according to the present embodiment, the semiconductor device 1 having a structure adopted for reducing the recovering time and the method for manufacturing thereof can be achieved realized.

The gate electrode 44 is provided on the gap region. The gate electrode 44 is employed for an etch stop, so that the opening 24 (and the contact plug 34) having the structure, in which the opening and the contact plug does not reach to the n-type region 14, can be formed.

The opening 24 is formed simultaneously with forming the openings 22 and 26 serving as openings for ordinary contacts. This allows forming the opening 24 without increasing the number of the required manufacturing process operations.

The operation of injecting an impurity is performed after forming the opening for the contact. Although the injection damage is generally recovered by a thermal processing occurred in the operation of diffusing, the injection of an impurity in operations after forming the contact opening, in which no thermal processing at an elevated temperature not performed, prevents a recovery of an injection damage, allowing a damaged layer remaining in the manufactured product of the semiconductor device 1.

A plurality of openings 22 are formed per one p-type diffusion layer 16, a plurality of openings 24 are formed per one gap region. The openings 22 and 24 are divided into a plurality of openings, so that an injection of an impurity over wider area can be achieved, without a need for having wider opening area of the respective openings. Although larger area of the openings causes an obstacle in the formation of the contact plug, an injection of an impurity over wider area can be achieved according to the present embodiment, while preventing such adverse effects.

The prior art will be explained in detail with reference to the above-listed Japanese Patent Laid-Open No. H10-74,959, in order to facilitate the understanding of the present invention. The above-listed Japanese Patent Laid-Open No. H10-74,959 describes that a diffusion layer of a diode is irradiated with proton and electron, and a "low-lifetime layer" is formed, so that a loss in the reverse-recovery is prevented. In order to form a low-lifetime layer under a diffusion layer of a region covered with oxide film, it is necessary to perform an irradiation with proton with higher energy. Concerning such technical aspect, when the entire surface is irradiated as described in Japanese Patent Laid-Open No. H10-74,959, or when a size of an element is larger, an use of thicker mask material allows a selective irradiation. Nevertheless, since a limitation generally exists in the thickness of the mask material available for a large scale integrated circuit (LSI), a problem of injecting proton or the like into unwanted regions other than the targeted region is occurred, when the injection is performed with higher energy in the prior art. On the contrary, since the opening for contact is additionally formed in the section (i.e., section above the gap region) except the section where the ordinary opening for contact is formed in the present embodiment according to the present invention, an impurity can be more deeply injected into a specified site with lower energy.

Figure 4:
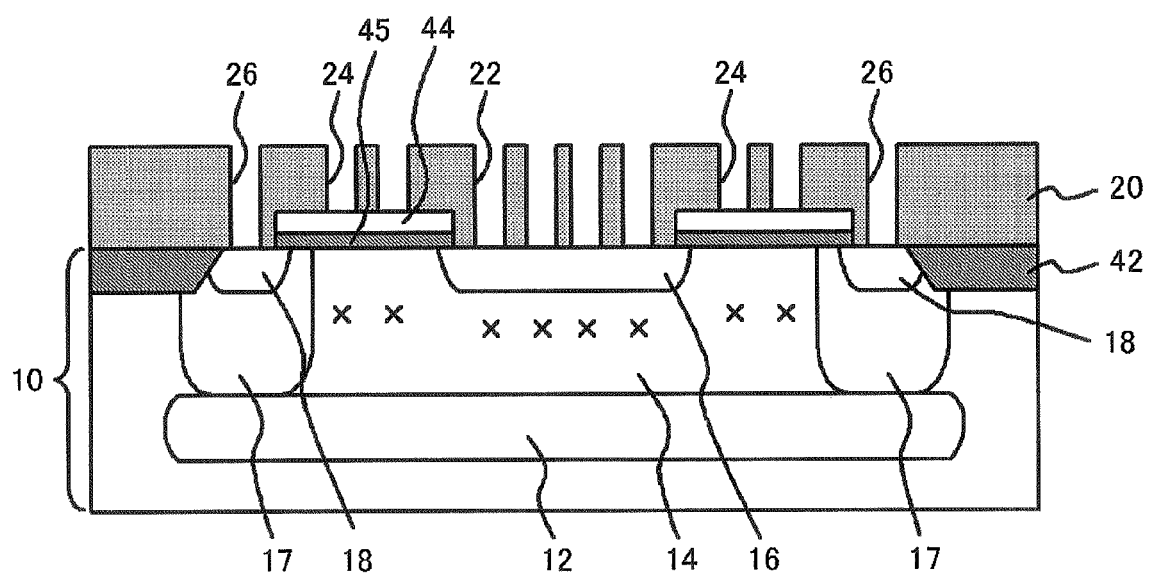
FIG. 4 is a cross-sectional view, illustrating a modified embodiment of the semiconductor device of FIG. 1.

While the exemplary implementation of forming the gate electrode 44 directly on the semiconductor substrate 10 is illustrated in the present embodiment, the gate electrode 44 may alternatively be formed through the gate insulating film 45, as shown in FIG. 4. In FIG. 4, none of the element isolation region 42 is formed between the p-type diffusion layer 16 and the n-type diffusion layer 18.

Figure 5:
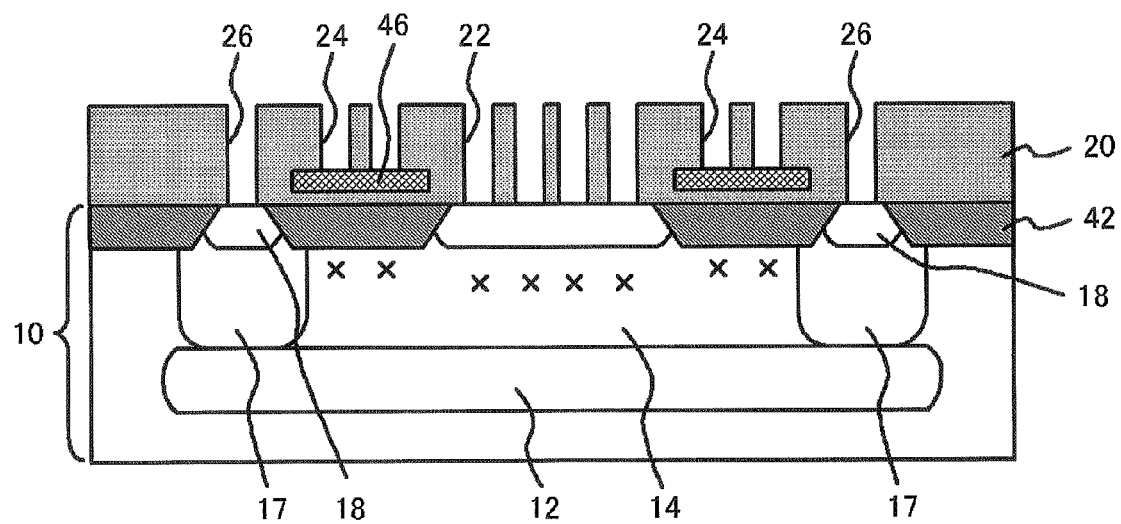
FIG. 5 is a cross-sectional view, illustrating a modified embodiment of a semiconductor device of FIG. 1.

Further, a resistive element 46 serving as a pseudo element may also be formed, in place of forming the gate electrode 44, as shown in FIG. 5. Such resistive element 46 may also be utilized as an etch stop for forming the opening 24. The resistive element 46 may be composed of, for example, polysilicon.

Figure 6:
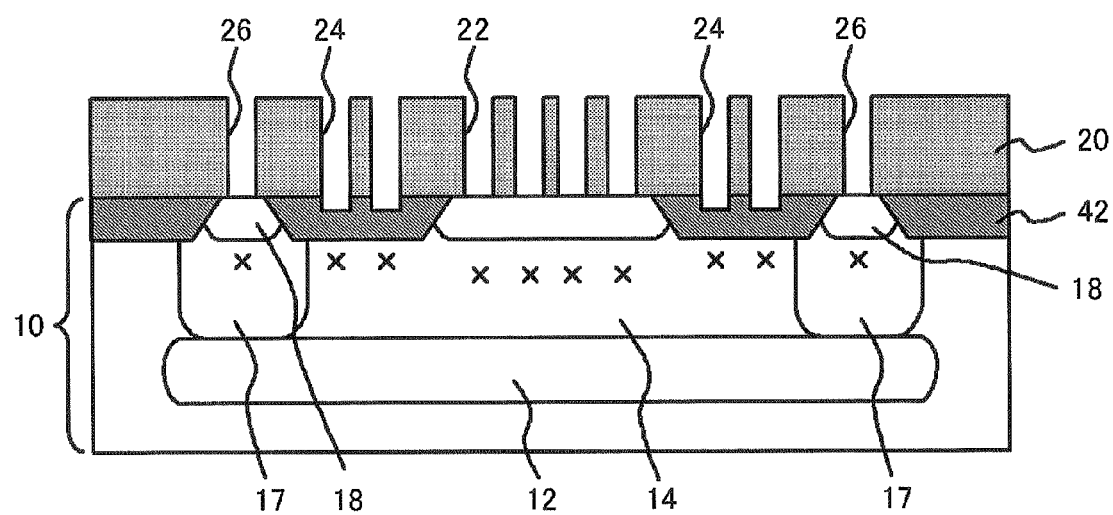
FIG. 6 is a cross-sectional view, illustrating a modified embodiment of a semiconductor device of FIG. 1.

Further, as shown in FIG. 6, none of the gate electrode 44 or the resistive element 46 may be provided on the gap region. In such case, the element isolation region 42 between the p-type diffusion layer 16 and the n-type diffusion layer 18 may be utilized as an etch stop for forming the opening 24 in FIG. 4 to FIG. 6, the contact plug is not shown.

While the exemplary implementation of not injecting an impurity under the opening 26 is illustrated in the present embodiment, such impurity may be injected to such section. In such case, in FIG. 3B, the opening 26 is not covered with the photo resist R1. FIG. 6 as above-described illustrates an exemplary implementation, in which an impurity is also injected under the opening 26.

Second Embodiment

Figure 7:
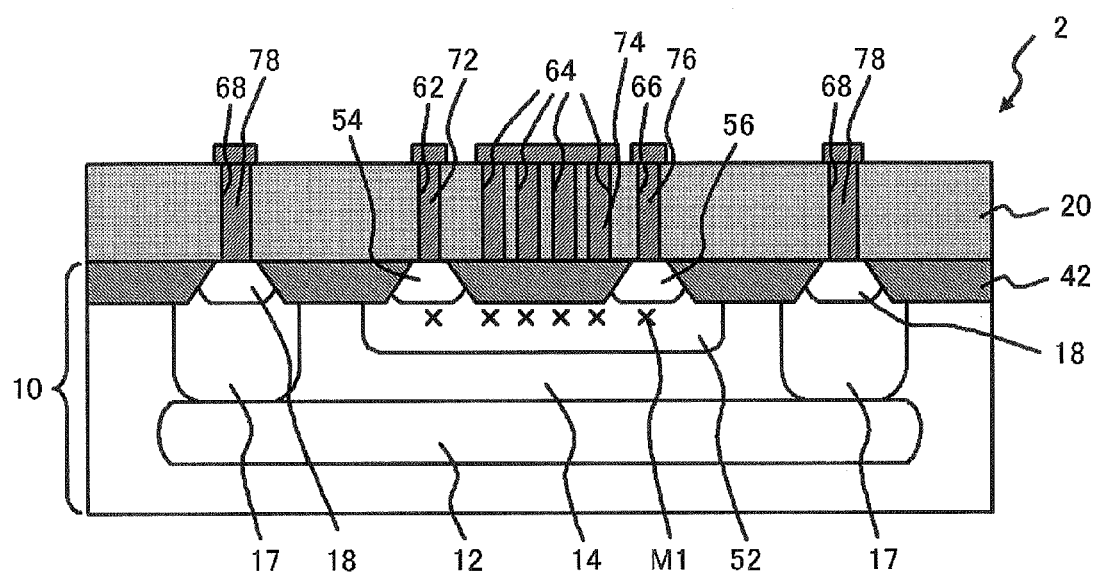
FIG. 7 is a cross-sectional view, illustrating second embodiment of a semiconductor device according to the present invention.

FIG. 7 is a cross-sectional view, illustrating second embodiment of a semiconductor device according to the present invention. While first embodiment illustrates the exemplary implementation of applying the configuration of the present invention to the diode, the present embodiment is an exemplary implementation of applying the present invention to bipolar transistors. A semiconductor device 2 includes a p-type region 52 serving as a base of a bipolar transistor, formed in an n-type region 14 of a semiconductor substrate 10. The n-type region 14 functions as a collector of the bipolar transistor. A p+ type diffusion layer 54 (first impurity-diffusing layer) and an n+ type diffusion layer 56 (second impurity-diffusing layer) are formed in the surface layer of the p-type region 52. The p+ type diffusion layer 54 functions as a contact layer of the p-type region 52, and the n+ type diffusion layer 56 functions as an emitter of the above-described bipolar transistor.

An opening 62 (first opening), an opening 64 (second opening), an opening 66 and an opening 68 are formed in the interlayer insulating film 20 on the semiconductor substrate 10. The opening 62, the opening 66 and the opening 68 are formed above the p+ type diffusion layer 54, above the n+ type diffusion layer 56 and above the n+ type diffusion layer 18, respectively. The opening 64 is formed above the gap region that is a region between the p+ type diffusion layer 54 and the n+ type diffusion layer 56.

A contact plug 72, a contact plug 74, a contact plug 76 and a contact plug 78 are buried in the opening 62, the opening 64, the opening 66 and the opening 68, respectively. The contact plug 72, the contact plug 76 and the contact plug 78 function as contact plugs for a base, an emitter and a collector, respectively. Meanwhile, the contact plug 74 serves as a pseudo contact plug. An impurity is injected to regions of the semiconductor substrate 10 under the opening 62, under the opening 64 and under the opening 66.

The semiconductor device 2 having such constitution can be manufactured by a method similar to that for the semiconductor device 1. First of all, the interlayer insulating film 20 is patterned to form the openings 62, 64, 66 and 68. At this time, the element isolation region 42 is utilized as an etch stop to allow forming the opening 64 so as to reach to the p-type region 52. Thereafter, an impurity may be injected into the semiconductor substrate 10 through an opening formed in the interlayer insulating film 20. At this time, it is sufficient to inject an impurity to at least the portions under the opening 62 and under the opening 64, among the openings 62, 64, 66 and 68, and thus it is not essential to inject an impurity into the sections under all openings. Therefore, the injection of an impurity may be performed while covering one of or both of the opening 66 and the opening 68 with a photo resist or the like. FIG. 7 illustrates an exemplary implementation, in which an impurity is injected into the portions under the opening 62, under the opening 64 and under the opening 66, among the openings 62, 64, 66 and 68.

Since a damaged layer is also formed in the gap region in the present embodiment, the semiconductor device 2 having a structure adopted for providing a reduced recovering time and the method for manufacturing thereof are achieved. Other advantageous effects of the present embodiment are similar to that obtained in the above-described embodiment.

Figure 8:
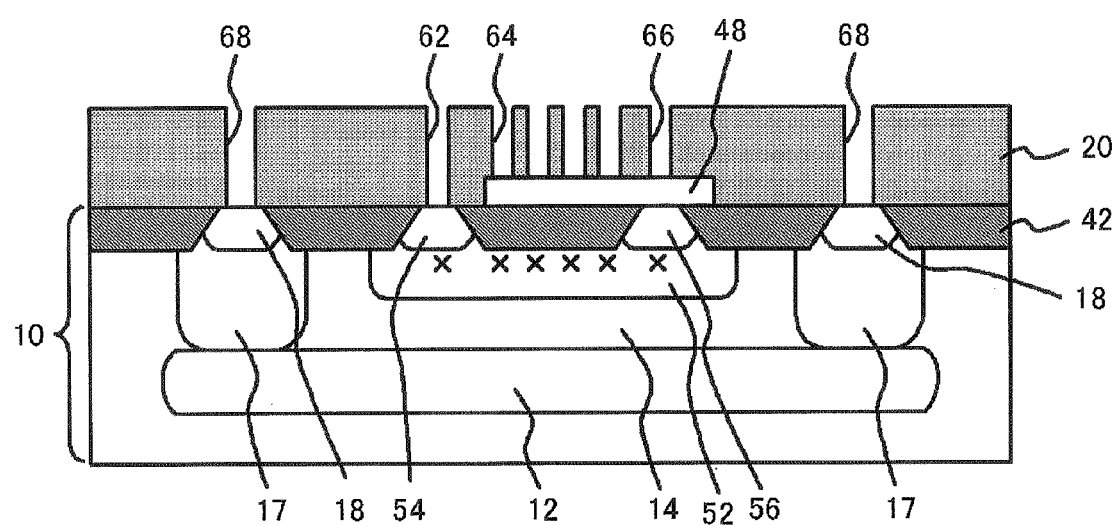
FIG. 8 is a cross-sectional view, illustrating a modified embodiment of the semiconductor device of FIG. 7.

While the exemplary implementation utilizing the element isolation region 42 as an etch stop is illustrated in the present embodiment, as shown in FIG. 8, an emitter electrode film 48, which may be formed on the semiconductor substrate 10, may be utilized as an etch stop. The emitter electrode film 48 may be formed to extend from the portion above the n+ type diffusion layer 56 to the above-described gap region before forming the interlayer insulating film 20.

Figure 9:
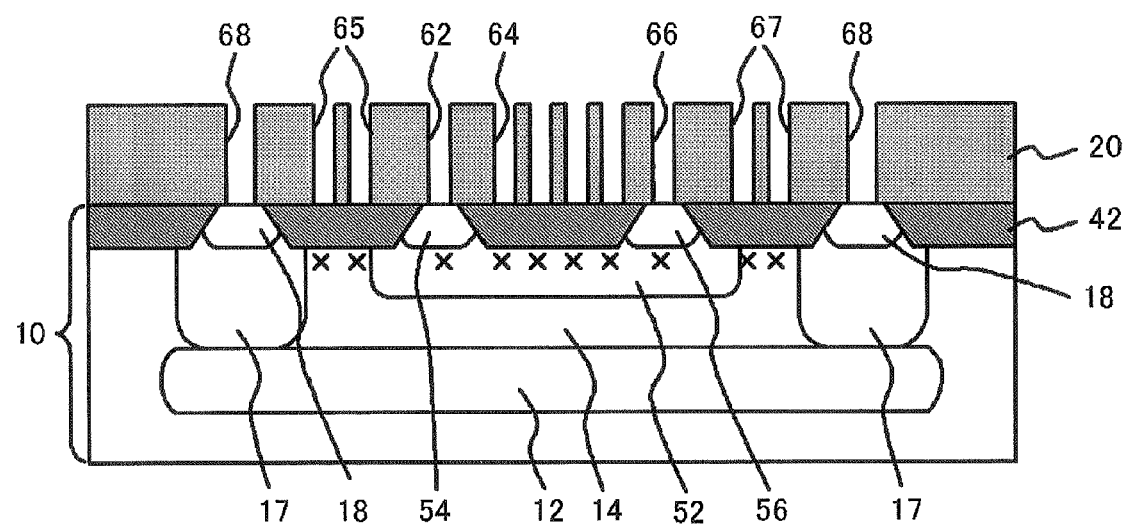
FIG. 9 is a cross-sectional view, illustrating a modified embodiment of the semiconductor device of FIG. 7.

Further, opening(s) may be formed above a region between the p+ type diffusion layer 54 and the n+ type diffusion layer 18 and/or a region between the n+ type diffusion layer 56 and the n+ type diffusion layer 18, and an impurity may be injected through the opening(s). FIG. 9 illustrates an exemplary implementation, in which an opening 65 is formed above a region between the p+ type diffusion layer 54 and the n+ type diffusion layer 18, an opening 67 is formed above a region between the n+ type diffusion layer 56 and the n+ type diffusion layer 18. Having such configuration, a recombination rate of minority carrier can be enhanced in these regions.

Figure 10A:
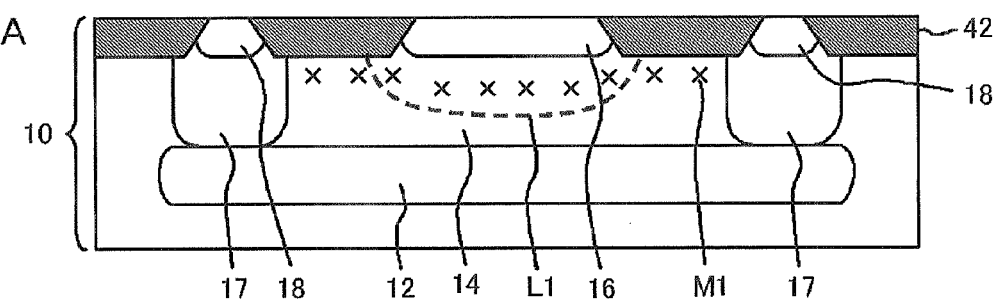
FIG. 10A and FIG. 10B are cross-sectional views, useful in describing a modified embodiment.
Figure 10B:
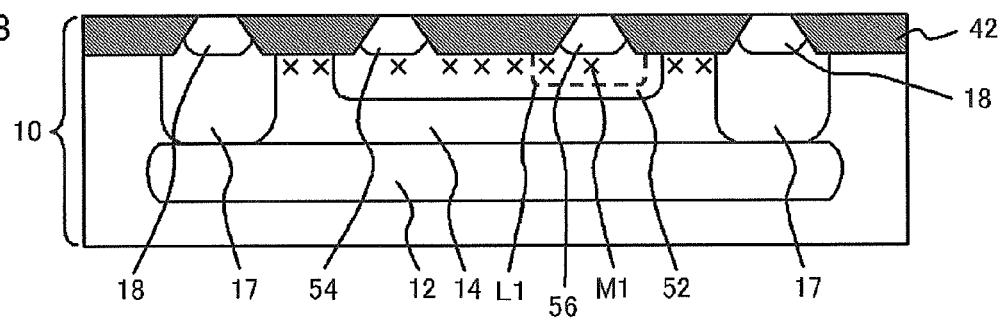
Figure 11:
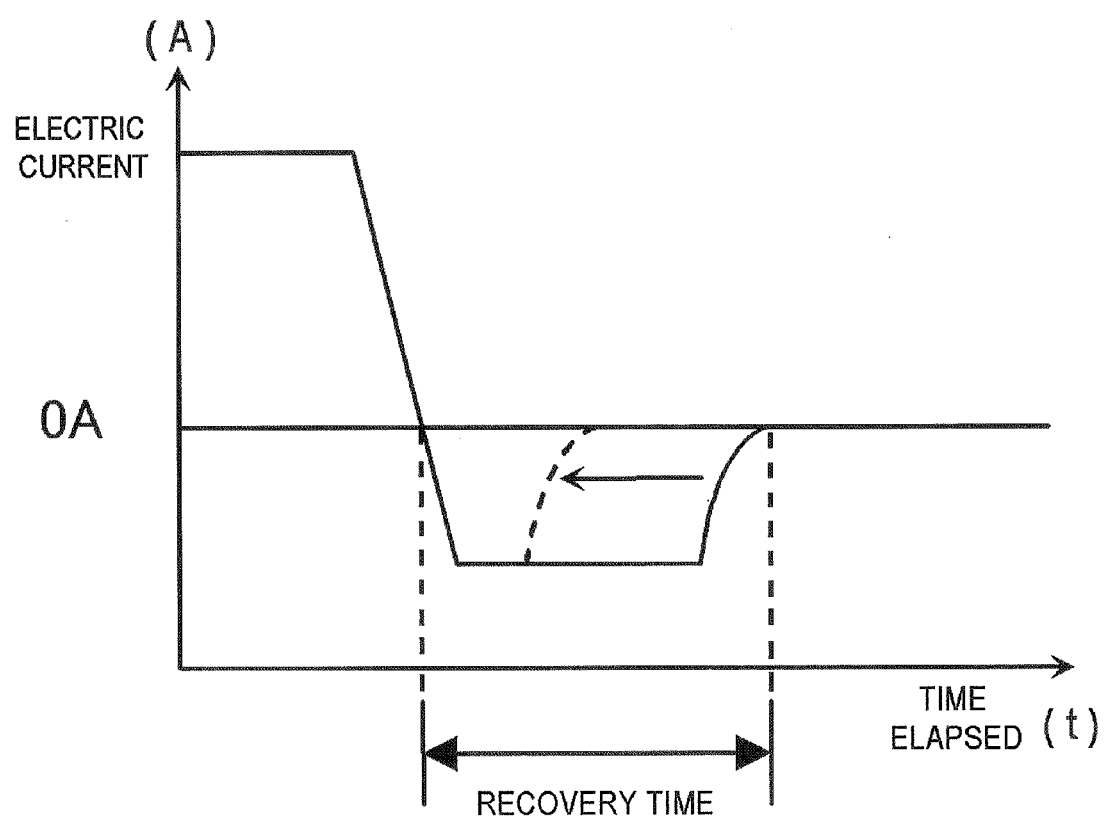
FIG. 11 is a graph, useful in describing recovery time.
Figure 12:
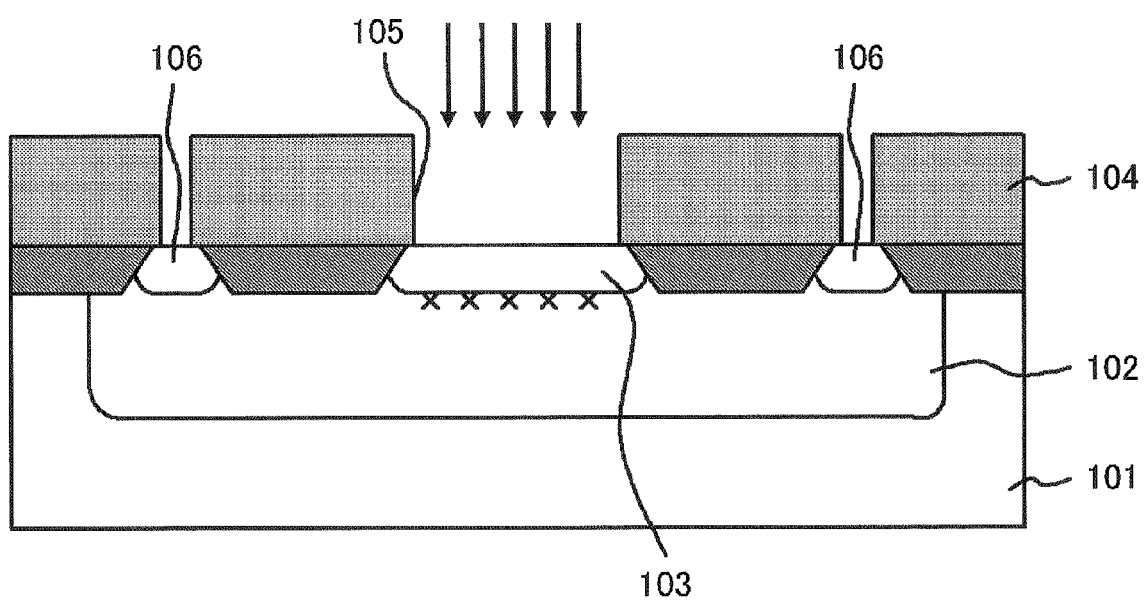
FIG. 12 is a cross-sectional view, useful in describing a conventional method for manufacturing a semiconductor device.

It is intended that the semiconductor devices and the methods for manufacturing thereof according to the present invention are not limited to the configurations illustrated in the above-described embodiments, and thus various modifications thereof are also available. For example, in each of the above-described embodiments, the section formed in the side of the first impurity-diffusing layer in the depleted layer that is formed when the semiconductor device (diode or bipolar transistor) is applied with a reverse voltage may be doped with an impurity. This allows providing further reduced recovery time. However, an increased leakage current may correspondingly occurred. Therefore, it may be a choice according to the desired characteristics of the semiconductor device, whether an impurity is injected to the above-described section of the depleted layer or an impurity is injected to sections except the above-described section In other words, it could be understood that properties of the semiconductor device can be controlled by suitably selecting the location of the opening above the gap region. FIG. 10A and FIG. 10B show exemplary implementations of injecting an impurity into the above-described section of the depleted layer in a diode and a bipolar transistor, respectively. However, in these diagrams, illustrations of interlayer insulating films and the like are not presented. Besides, a boundary of a depleted layer is illustrated by a dotted line L1.

It is apparent that the present invention is not limited to the above embodiment, and may be modified and changed without departing from the scope and spirit of the invention.

What is claimed is:

1. A method for manufacturing a semiconductor device, comprising:

preparing a semiconductor substrate having a first impurity-diffusing layer of a first conductivity type and a second impurity-diffusing layer of a second conductivity type different from the first conductivity type, both of which are formed in a surface layer;

forming an interlayer insulating film on said semiconductor substrate;

patterning said interlayer insulating film so that a first opening is formed above said first impurity-diffusing layer and a second opening is formed above a gap region, which is a region between said first impurity-diffusing layer and said second impurity-diffusing layer immediately adjacent to said first impurity-diffusing layer above which said first opening is formed; and injecting an impurity to said semiconductor substrate through said first and said second openings, wherein said first impurity-diffusing layer is formed in a region having said second conductivity type, and said first impurity-diffusing layer and said region constitutes a diode, and wherein said second impurity-diffusing layer functions as a contact layer of said region of said second conductivity type, wherein an impurity injected in said injecting an impurity is selected from a group consisting of fluorine (F), silicon (Si), carbon (C) and Germanium (Ge), and wherein said semiconductor substrate is provided with a polysilicon film in said gap region, and wherein said patterning said interlayer insulating film includes forming said second opening by utilizing said polysilicon film as an etch stop.

2. The method for manufacturing the semiconductor device as set forth in claim 1, wherein said patterning said interlayer insulating film includes forming said second opening so as not to reach to said region having said second conductivity type.

3. The method for manufacturing the semiconductor device as set forth in claim 1, wherein said injecting an impurity includes injecting an impurity into a section of a depleted layer of said diode, said section being formed in a side portion of said first impurity-diffusing layer.

4. The method for manufacturing the semiconductor device as set forth in claim 1, wherein said injecting an impurity includes injecting an impurity into a depleted layer of said diode except a section thereof, said section being formed in a side portion of said first impurity-diffusing layer.

5. The method for manufacturing the semiconductor device as set forth in claim 1, wherein said second impurity-diffusing layer is formed in a region of said second conductivity type that functions as a base of a bipolar transistor, and functions as a contact layer of said region, wherein said first impurity-diffusing layer is formed in said region of said second conductivity type and functions as an emitter of said bipolar transistor, and wherein said region having said second conductivity type is formed in a region having said first conductivity type that functions as a collector of said bipolar transistor.

6. The method for manufacturing the semiconductor device as set forth in claim 5, wherein said patterning said interlayer insulating film includes forming said second opening so as not to reach said region having said second conductivity type.

7. The method for manufacturing the semiconductor device as set forth in claim 5, further comprising, before said forming said interlayer insulating film, forming an emitter electrode film on said first impurity-diffusing layer of said semiconductor substrate so as to extend to reach above said gap region.

8. The method for manufacturing the semiconductor device as set forth in claim 5, wherein said injecting an impurity includes injecting an impurity into a section of a depleted layer of said bipolar transistor, said section being formed in a side portion of said first impurity-diffusing layer.

9. The method for manufacturing the semiconductor device as set forth in claim 5, wherein said injecting an impurity includes injecting an impurity into a depleted layer of said bipolar transistor except a section thereof, said section being formed in a side portion of said first impurity-diffusing layer.

10. The method for manufacturing the semiconductor device as set forth in claim 1, further comprising, before said forming said interlayer insulating film, forming, from said polysilicon film, a gate electrode on said gap region of said semiconductor substrate.

11. The method for manufacturing the semiconductor device as set forth in claim 1, further comprising, before said forming said interlayer insulating film, forming, from said polysilicon film, a resistive element said semiconductor substrate.

12. The method for manufacturing the semiconductor device as set forth in claim 1, further comprising, after said injecting an impurity, plugging said first and said second openings with an electroconducting plug.

13. The method for manufacturing the semiconductor device as set forth in claim 1, wherein said patterning said interlayer insulating film includes forming a plurality of said first openings per one of said first impurity-diffusing layer.

14. The method for manufacturing the semiconductor device as set forth in claim 1, wherein said patterning said interlayer insulating film includes forming a plurality of said second openings per one of said gap region.

15. The method for manufacturing the semiconductor device set forth in claim 1,
wherein, in said injecting an impurity, said impurity is injected so as to form a damaged layer in said gap region.

16. The method for manufacturing the semiconductor device set forth in claim 1,
wherein, said impurity in said injecting an impurity functions as neither a donor nor an acceptor.

* * * * *